US010126432B2

United States Patent
Nagata et al.

(10) Patent No.: US 10,126,432 B2
(45) Date of Patent: Nov. 13, 2018

(54) SCINTILLATOR, SCINTILLATOR PANEL, AND RADIOLOGICAL IMAGE CONVERSION PANEL

(71) Applicant: KONICA MINOLTA, INC., Chiyoda-ku, Tokyo (JP)

(72) Inventors: Yasushi Nagata, Kodaira (JP); Hiroshi Isa, Akishima (JP); Musashi Matsumoto, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/454,461

(22) Filed: Mar. 9, 2017

(65) Prior Publication Data
US 2017/0261621 A1    Sep. 14, 2017

(30) Foreign Application Priority Data
Mar. 10, 2016  (JP) ................................. 2016-047304

(51) Int. Cl.
*G01T 1/20* (2006.01)
*H01L 27/146* (2006.01)

(52) U.S. Cl.
CPC .......... *G01T 1/2002* (2013.01); *G01T 1/2018* (2013.01); *H01L 27/14629* (2013.01); *H01L 27/14676* (2013.01)

(58) Field of Classification Search
CPC ................. G01T 1/2002; G01T 1/2018; H01L 27/14629; H01L 27/14676
USPC ........................................................ 250/368
See application file for complete search history.

(56) References Cited

U.S. PATENT DOCUMENTS

| 3,446,745 A | * | 5/1969 | Brinckmann | ........... | G01T 1/202 250/483.1 |
| 4,449,780 A | * | 5/1984 | Swinehart | ............... | C30B 11/00 117/76 |
| 4,839,090 A | * | 6/1989 | Rosette | .............. | C09K 11/0833 252/301.4 H |
| 5,166,073 A | * | 11/1992 | Lefkowitz | ............... | G01T 1/161 250/485.1 |
| 5,427,817 A | * | 6/1995 | Goodman | ............ | C09K 11/628 427/157 |
| 5,904,781 A | * | 5/1999 | Goodman | ............... | C23C 14/06 118/726 |
| 2008/0099694 A1 | * | 5/2008 | Shoji | ..................... | G01T 1/2018 250/483.1 |

(Continued)

FOREIGN PATENT DOCUMENTS

| JP | 2008051793 A | 3/2008 |
| JP | 2012098110 A | 5/2012 |
| JP | 2015017972 A | 1/2015 |

*Primary Examiner* — David Porta
*Assistant Examiner* — Gisselle Gutierrez
(74) *Attorney, Agent, or Firm* — Cantor Colburn LLP

(57) ABSTRACT

A scintillator includes a scintillator layer including a phosphor and an augmenting agent and has an optical reflectance A1 at a wavelength 440 nm and an optical reflectance B1 at a wavelength 520 nm, wherein when an optical reflectance at the wavelength 440 nm is defined as A2 and an optical reflectance at the wavelength 520 nm is defined as B2 after exposure to 2,000 R of radiation, ratios between the optical reflectances "A=A2/A1" and "B=B2/B1" before and after exposure to radiation satisfy "0.70≤A/B≤1.10".

9 Claims, 3 Drawing Sheets

(56) References Cited

U.S. PATENT DOCUMENTS

| | | | |
|---|---|---|---|
| 2010/0116997 A1* | 5/2010 | Homma | H01L 27/1446 250/368 |
| 2011/0114847 A1* | 5/2011 | Fujieda | C08K 3/22 250/370.09 |
| 2012/0001282 A1* | 1/2012 | Goto | C09K 11/628 257/429 |
| 2012/0161074 A1* | 6/2012 | Ohashi | C09K 11/628 252/301.4 H |
| 2015/0060678 A1* | 3/2015 | Watano | G01T 1/2018 250/367 |
| 2015/0310953 A1* | 10/2015 | Okamura | G01T 1/2002 250/487.1 |
| 2016/0041272 A1* | 2/2016 | Kondo | H01L 31/02322 250/361 R |

* cited by examiner

SCINTILLATOR, SCINTILLATOR PANEL, AND RADIOLOGICAL IMAGE CONVERSION PANEL

CROSS REFERENCE TO RELATED APPLICATIONS

The entire disclosure of Japanese Patent Application No. 2016-047304 filed on Mar. 10, 2016 including description, claims, drawings, and abstract are incorporated herein by reference in its entirety.

BACKGROUND OF THE INVENTION

Field of the Invention

The present invention relates to a scintillator, a scintillator panel, and a radiological image conversion panel used at the time of forming a radiological image.

Description of the Related Art

In the related art, a radiological image such as an X-ray image is widely used to diagnose a medical state in medical sites. Particularly, a radiological image using a screen-film system has achieved both high image quality and high sensitivity in this long-time history, and as a result thereof, the radiological image is used in worldwide medical sites as an imaging system that has both high reliability and excellent cost performance. However, such image information is so-called analog image information, and free image processing and instantaneous electric transmission like digital image information currently continuously developed may not be performed.

Recently, digital-mode radiological image detectors represented by computed radiography (CR), a flat panel detector (FPD), and the like are newly released. In these radiological image detectors, a digital radiological image can be directly obtained, an image can be directly displayed on an image display device such as a panel utilizing a cathode tube, a liquid crystal panel, and the like, and convenience of diagnosis work in a hospital or a health clinic is significantly improved.

In the above-described FPD, in principle thereof, a scintillator panel including a phosphor (scintillator) layer made of an X-ray phosphor having characteristics to convert radiated X-rays to visible light and emit the visible light is used in order to convert the X-rays to the visible light. At this point, there may be problems in which luminance of the scintillator itself is reduced (also referred to a luminance "weakening") due to long-time exposure to the X-rays and calibration is needed.

The inventors of the present invention consider that such problems are caused by influence of content of an augmenting agent.

As an example of using an augmenting agent together with a phosphor, an appropriate value of a Tl concentration inside a CsI/Tl phosphor layer is 0.38 to 1.91 wt % in JP 2012-098110 A, and JP 2012-098110 A discloses a fact that there is no difference observed in a sensitivity characteristics even when an average Tl concentration is set to 0.3 wt % which is lower compared to the Tl concentration in the related art.

Additionally, in JP 2008-051793 A, it is disclosed that a concentration of an augmenting agent is set high (0.7 mol % or more) on a radiation incidence side and set low (0.3 mol % or more) on a light detector side inside a scintillator layer formed of an aggregate of columnar crystals.

Furthermore, the applicant of the present application also proposes in JP 2015-017972 A that an augmenting agent concentration profile curve in a thickness direction of a scintillator layer has two or more peaks and an amount of the augmenting agent existing in a region up to the thickness of 100 μm from a main surface facing a photoelectric conversion element of the scintillator layer is 0.3 to 0.7 mol %.

There also is a Non-Patent Literature that refers to influence of content of an augmenting agent. For example, Jing, T., et al. of "Evaluation of a structured cesium iodide film for radiation imaging purposes." Nuclear Science Symposium and Medical Imaging Conference in 1993, 1993 IEEE Conference Record, IEEE, 1994 states that a concentration of an augmenting agent (thallium) so as to have an optimal amount of luminescence is 0.1 to 0.2 mol %. Additionally, the same literature also states that the concentration should not be set to 0.02 mol % or less in order to have a favorable amount of luminescence, and discloses a fact that an extremely low concentration is rather not preferred.

SUMMARY OF THE INVENTION

However, all of the related arts provide recitation considering "light intensity" referred to as an amount of luminescence, luminance, and sensitivity, and provide no recitation recognizing/considering luminance decrease under long-time exposure to radiation.

The inventors of the present invention consider, as this reason, influence from decrease of an optical reflectance of a scintillator itself. Accordingly, earnest study is made based on change of the optical reflectance, and as a result thereof, it is found that the above-described problems can be solved by adjusting change of the optical reflectance before and after exposure to radiation at wavelengths of 440 nm and 520 nm so as to satisfy a predetermined relation, and the present invention is completed.

[1] To solve at least one of the abovementioned problems, according to an aspect, a scintillator reflecting one aspect of the present invention comprises a scintillator layer including a phosphor and an augmenting agent and has an optical reflectance A1 at a wavelength 440 nm and an optical reflectance B1 at a wavelength 520 nm, wherein when an optical reflectance at the wavelength 440 nm is defined as A2 and an optical reflectance at the wavelength 520 nm is defined as B2 after exposure to 2,000 R of radiation, ratios between the optical reflectances "A=A2/A1" and "B=B2/B1" before and after exposure to radiation satisfy "0.70≤A/B≤1.10".

[2] The scintillator of Item. 1, wherein a concentration of an augmenting agent included in the scintillator is preferably 0.005 to 0.2 mol %.

[3] The scintillator of Item. 2, wherein a concentration of an augmenting agent included in the scintillator is preferably 0.01 to 0.15 mol %.

[4] The scintillator of Items. 1 to 3, wherein the scintillator preferably includes at least cesium iodide as a parent material.

[5] The scintillator of Items. 1 to 4, wherein an augmenting agent included in the scintillator preferably includes at least thallium.

[6] The scintillator of Item. 5, wherein an augmenting agent included in the scintillator preferably includes at least sodium together with thallium.

[7] To solve at least one of the abovementioned problems, according to an aspect, a scintillator panel reflecting one aspect of the present invention is formed by disposing a layer of the scintillator of Items. 1 to 6 on a support body.

[8] To solve at least one of the abovementioned problems, according to an aspect, a radiological image conversion panel reflecting one aspect of the present invention is formed by disposing a layer of the scintillator of Items. 1 to 6 on a photoelectric conversion panel.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Hereinafter, a scintillator according to an embodiment of the present invention will be specifically described with reference to the drawings. However, the scope of the invention is not limited to the illustrated examples.

Scintillator

The scintillator according to an embodiment of the present invention includes a phosphor adapted to absorb energy of incident radiation such as X-rays and emit light, and is provided with a columnar crystal scintillator layer including the phosphor and an augmenting agent.

In the scintillator of the present invention, change after exposure to a predetermined amount of radiation is defined for an optical reflectance at a wavelength 440 nm and an optical reflectance at a wavelength 520 nm.

Figure 1:
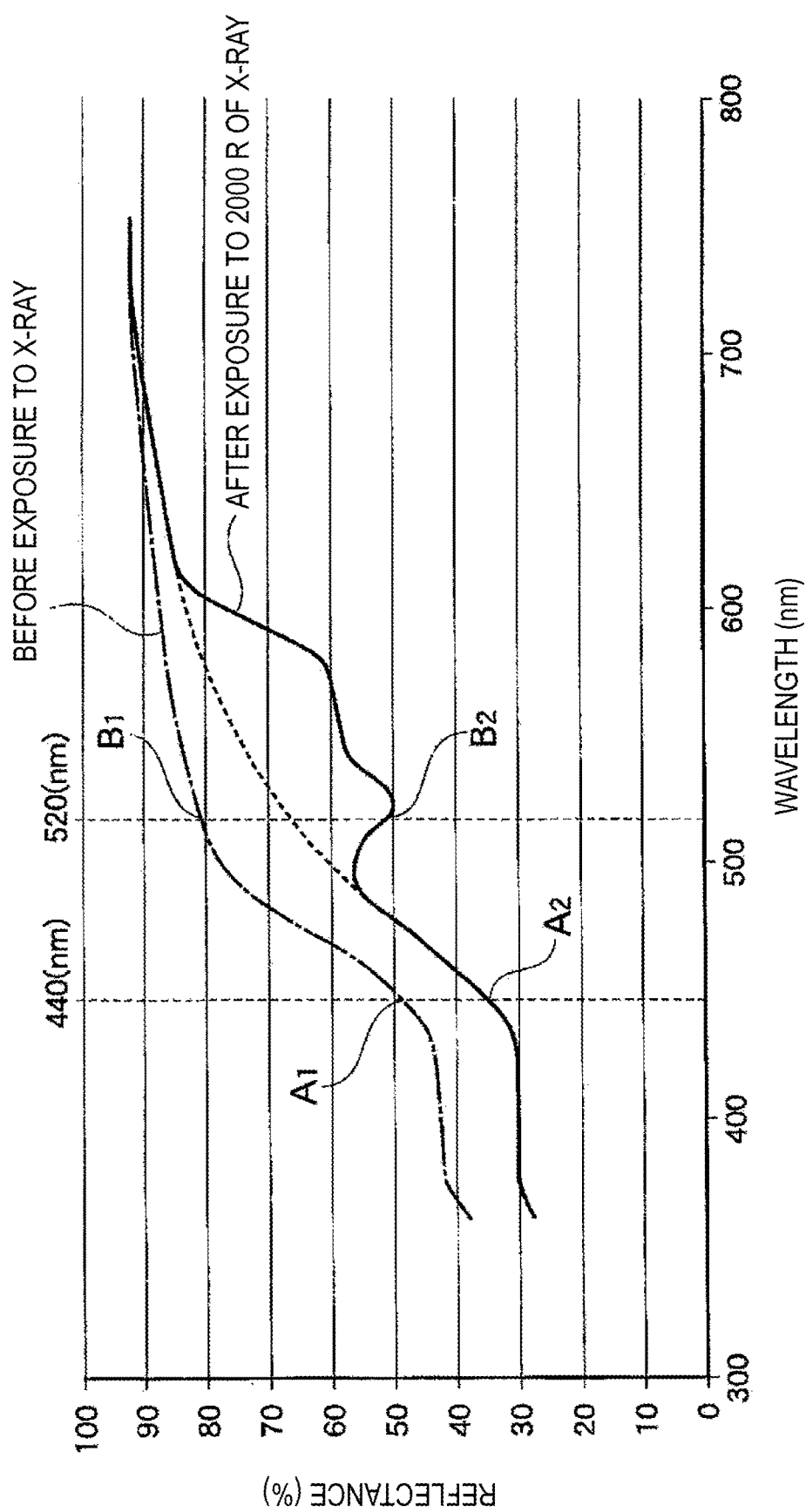
FIG. 1 is a conceptual diagram illustrating outline of optical reflectances A and B defined in an embodiment of the present invention.

FIG. 1 illustrates outline of the optical reflectances before and after the scintillator is exposed to radiation. Before exposure to radiation, a curve in which the optical reflectance changes between the wavelengths 450 and 500 nm is shown as illustrated in FIG. 1.

In contrast, after exposure to radiation, the optical reflectance of the scintillator on a high wavelength side is largely influenced and decreased. Especially, a decrease width is large in a range of 500 to 550 nm, and particularly the reflectance is notedly decreased at 520 nm.

Normally, the scintillator has a light receiving element that is sensitive at 550 nm in order to cause X-rays to emit green light (center wavelength: 550 nm). Therefore, decrease of the optical reflectance can be more notedly grasped at a wavelength near 550 nm.

Therefore, in the scintillator of the present invention, an optical reflectance of the scintillator at a wavelength of 440 nm is defined as $A2$ and an optical reflectance at a wavelength of 520 nm is defined as $B2$ after exposure to 2,000 R of X-rays as radiation, an optical reflectance of the scintillator at the wavelength 440 nm is defined as $A1$, and an optical reflectance at the wavelength of 520 nm is defined as $B1$ before exposure to the same X-rays, and $A=A2/A1$ and $B=B2/B1$ before and after exposure to radiation are respectively acquired, and the optical reflectance ratios A and B are to satisfy $A \leq B$.

In other words, a change rate of the optical reflectance at 520 nm is equal to or less than a change rate of the optical reflectance at 440 nm. Thus, the scintillator having small change of the optical reflectance at 520 nm has characteristics in which a radiation resistance property is high and luminance of the scintillator itself is little deceased after exposure to radiation.

Incidentally, 440 nm is the wavelength to be the base of the present invention, and change of the optical reflectance of the scintillator has a constant rate before and after exposure to radiation regardless of a composition of the scintillator.

A relation between the optical reflectance A and B satisfies $0.70 \leq A/B \leq 1.1$, and furthermore, preferably satisfies $0.75 \leq A/B \leq 1.02$, and more preferably satisfies $0.80 \leq A/B \leq 0.95$. The scintillator satisfying these relational expressions has a high radiation resistance property, and a decrease rate of luminance after exposure to 2000 R is extremely little. With use of such a scintillator, operation such as calibration is not needed or the number of times thereof can be reduced.

A material constituting the scintillator is not limited as far as the material can effectively convert, to light, energy of X-rays having entered from the outside. Therefore, as far as the above-mentioned conditions are satisfied, various kinds of known phosphors in the related arts can be used as the scintillator. Particularly, cesium iodide (CsI), gadolinium oxysulfide (GOS), cadmium tungstate (CWO), gadolinium silicate (GSO), bismuth germanate (BGO), lutetium silicate (LSO), lead tungstate (PWO), and the like can be suitably used. Meanwhile, the scintillator used in the present invention is not limited to a phosphor such as CsI that emits instantaneous light, and a stimulable phosphor such as cesium bromide (CsBr) may also be used depending on use.

In the present invention, CsI is especially preferred among these materials because CsI has relatively high efficiency in converting energy of radiation such as X-rays to visible light and when CsI is combined with an augmenting agent, it is possible to forma scintillator in which an optical reflectance is decreased little at a specific wavelength as described above.

In the present invention, preferably, CsI is adopted as a phosphor parent material and an augmenting agent is included together therewith. A concentration of the augmenting agent is indicated by mol %. The concentration of the augmenting agent included in the scintillator is, preferably, 0.005 to 0.25 mol %, more preferably, 0.005 to 0.20 mol %, and furthermore preferably, 0.01 to 0.15 mol %. When consideration is given from the viewpoint that whether a radiological image obtained in the case of using the scintillator as an FPD is visible or not, the concentration of the augmenting agent is, preferably, at least 0.005 mol % or higher, more preferably, 0.01 mol % or more. However, in the case of exceeding 0.25 mol %, the radiation resistance property is degraded and calibration operation is needed in a short cycle, which is not preferable. Therefore, preferably, the concentration is kept within the above-mentioned range. When the augmenting agent having a concentration kept within this range is included, the scintillator satisfying the above-described predetermined optical reflectance can be formed, and also the scintillator having an excellent radiation resistance property can be obtained while keeping luminance at a level at which the radiological image is visible.

The augmenting agent preferably includes thallium (Tl), europium (Eu), indium (In), lithium (Li), potassium (K), rubidium (Rb), sodium (Na), and the like. These augmenting agents exist inside the scintillator in element states. Meanwhile, for the augmenting agents, thallium iodide (TlI), thallium bromide (TlBr), thallium chloride (TlCl), thallium fluoride (TlF and $TlF_3$), and the like are used, for example.

The augmenting agent contained in the scintillator preferably includes at least thallium. When thallium is included, a wavelength of fluorescence during exposure to X-rays is not deviated, and detection accuracy of fluorescence by a photoelectric conversion element is high. Furthermore, decrease of the optical reflectance after exposure to radiation at above-mentioned 520 nm can be reduced, and the scintillator satisfying the predetermined optical reflectance defined in the present invention can be obtained.

Preferably, the augmenting agent includes at least sodium together with thallium.

When sodium is included, luminance degraded by X-rays can be recovered in a short time, and the radiation resistance property is more improved. Sodium is included at a concentration rate of 0.1 to 5 mol %, preferably, 0.1 to 3 mol %. When sodium having a concentration kept within this range is included, X-ray characteristics can be maintained while keeping the high radiation resistance property.

Preferably, the scintillator layer is a columnar crystal, and may also be formed of a plurality of layers. A desirable mode is that the columnar crystals exist in a manner having root sections thereof independent from each other.

The columnar crystal can suppress scattering of emitted light inside the crystal by a light guide effect. As a method of forming the columnar crystal, a vapor phase deposition method may be exemplified. As the vapor phase deposition method, for example, a vapor deposition method, a sputtering method, a CVD method, an ion plating method, and the like can be used, but in the present invention, the vapor deposition method is particularly preferable. For example, a phosphor material and an augmenting agent are used as vapor deposition sources and vapor-deposited on a vapor deposition substrate by using a vapor deposition apparatus. For example, in the case of adopting CsI:Tl, a columnar crystal can be formed by simultaneously vapor-depositing CsI and TlI. Thus, the scintillator formed of the columnar crystal can be formed.

Additionally, the scintillator may also be formed by coating and drying dispersion liquid of a scintillator particle.

The scintillator layer has a film thickness of, preferably, 100 to 1000 μm, more preferably, 100 to 800 μm from the viewpoint of having good balance between luminance of the scintillator panel and sharpness of an obtained radiological image. Additionally, as recited in "Evaluation of a structured cesium iodide film for radiation imaging purposes." Nuclear Science Symposium and Medical Imaging Conference in 1993, 1993 IEEE Conference Record, IEEE, 1994 by Jing, T., et al., even in the case where the concentration of the augmenting agent (thallium) is decreased and an amount of luminescence is reduced, the reduced amount of luminescence can be covered by setting the film thickness to 400 to 800 μm and improving the amount of luminescence due to increase of the film thickness. Therefore, setting the film thickness to 400 to 800 μm is particularly preferable.

Manufacture of Scintillator

The scintillator is not particularly limited as far as the scintillator is specially made of a phosphor material, and the scintillator can be formed by, for example, the vapor deposition method.

In the following, an embodiment in the vapor deposition method will be described. A preferable mode is to form a scintillator layer by using a vapor deposition apparatus including an evaporation source and a support body rotating mechanism inside a vacuum container, setting a support body at the support body rotating mechanism, and performing vapor deposition of a phosphor material while rotating the support body. A plurality of evaporation sources can be disposed at positions on a circumference of a circle having a center around a center line vertical to the support body in the vicinity of a bottom surface inside the vacuum container. In this case, an interval between the support body and the evaporation source is, preferably, 100 to 1500 mm, more preferably, 200 to 1000 mm.

Meanwhile, at the time of forming the scintillator layer, three or more evaporation sources can be provided and the respective evaporation sources may be arranged at equal intervals or may also be arranged at varied intervals. Additionally, the interval between the support body and an evaporation source may be varied by each of the evaporation sources. Furthermore, a radius of the circle having the center around the center line vertical to the support body can be optionally set.

Since the plurality of evaporation sources is thus provided, a portion where vapor streams of the evaporation sources are overlapped is rectified, and crystallinity of the phosphor to be vapor-deposited on a surface of the support body can be uniformed. At this point, the more number of the evaporation sources is provided, at the more positions the vapor streams are rectified. Therefore, crystallinity of the phosphor can be uniformed in a wider range. Furthermore, since the evaporation sources are disposed at the positions on the circumference of the circle having the center around the center line vertical to the support body, a function to make the crystallinity uniform by rectifying the vapor streams can be isotropically obtained on the surface of the support body.

In other words, a concentration of an augmenting agent, a crystal diameter, and film thickness distribution can be satisfied by performing vapor deposition that satisfies in-plane distribution in a large area, and not only one piece of substrate is multi-chamfered by one-time vapor deposition but also a plurality of substrates can be multi-chamfered by setting the plurality of substrates at the same time. Additionally, production can also be efficiently conducted by performing vapor deposition for one large substrate and then cutting the same into multiple pieces.

Since the evaporation source houses the phosphor and heats the same by a resistive heating method, the evaporation source may be formed of a crucible made of alumina and surrounded by a heater, or may be formed of a combustion boat or a heater made of a metal having a high melting point.

Additionally, besides the resistive heating, the method of heating the phosphor may be a method such as heating by electron beams or heating by high frequency induction. However, in the present invention, a method of directly applying electric current and performing resistive heating, or a method of indirectly performing resistive heating for the crucible by using a surrounding heater is preferable from the viewpoints of having a relatively simple structure, easy handling, low cost, and applicability to a large number of substances. Furthermore, the evaporation source may also be a molecular beam source based on a molecular source epitaxial method.

A support body holder is, preferably, provided with a heater adapted to heat the support body. Adhesion of the support body to the support body holder can be enhanced and film quality of the scintillator layer is adjusted by heating the support body by this heater. Additionally, an absorbed matter on the surface of the support body is separated/removed, and an impurity layer is prevented from being generated between the surface of the support body and the phosphor.

Furthermore, a mechanism to circulate a warming medium or a heating medium may be included as a heating unit. Such a unit is suitable for a case where vapor deposition is performed while keeping a temperature of the support body at a relatively low temperature like 50 to 150° C. during vapor deposition of the phosphor.

Furthermore, a halogen lamp may also be included as the heating unit. Such a unit is suitable for case where vapor deposition is performed while keeping the temperature of the support body at a relatively high temperature like 150° C. or more during vapor deposition of the phosphor.

Furthermore, the support body holder is provided with a support body rotating mechanism adapted to rotate the support body in a horizontal direction. The support body rotating mechanism includes: a support body rotating shaft adapted to support the support body holder and also rotate the support body; and a motor disposed outside the vacuum container and functioning as a drive source of the support body rotating shaft.

Besides the above-described components, the vapor deposition apparatus has the vacuum container provided with a vacuum pump. The vacuum pump is adapted to evacuate a gas existing inside the vacuum container, and two or more kinds of vacuum pumps having different operating pressure ranges may be disposed in order to evacuate the gas up to a high vacuum range. As the vacuum pump, a rotary pump, a turbo-molecular pump, a cryopump, a diffusion pump, a mechanical booster, and the like may be used.

A mechanism adapted to introduce a gas into the vacuum container is provided in order to adjust a pressure inside a chamber. The gas to be introduced is generally inert gases such as Ne, Ar, and Kr. The pressure in the vacuum container may be adjusted by a gas amount to be introduced while evacuation is performed inside the vacuum container by the vacuum pump, or may also be adjusted by: stopping vacuum evacuation after performing vacuum evacuation until a pressure reaches a high vacuum state lower than a desired pressure; and then introducing the gas until the pressure reaches the desired pressure. Furthermore, the pressure inside the vacuum container may be controlled by providing, for example, a pressure control valve between the vacuum container and the vacuum pump, and adjusting a gas amount evacuated by the pump.

Additionally, a shutter to block a space reaching from the evaporation source to the support body is provided between the evaporation source and the support body in a manner openable and closable in a horizontal direction, and this shutter prevents a substance, other than an intended matter attached to the surface of the phosphor in the evaporation source, from evaporating at an initial stage of vapor deposition and being attached to the support body.

An exemplary method of manufacturing a scintillator panel arranged with the scintillator of the present invention on the support body by using the above-described manufacturing device will be described.

First, the support body holder is attached to the support body. Note that the support body will be described later. Additionally, the evaporation source is disposed on the circumference of the circle having the center around the center line vertical to the support body near the bottom surface of the vacuum container. Next, two or more of phosphor parent compounds (CsI: not including augmenting agent) and an augmenting agent (TlI) are filled in a crucible, a combustion boat, or the like, and set to the evaporation source. Preheating may also be performed in order to remove an impurity contained inside the filled phosphor parent materials and augmenting agent before vapor deposition. Preheating is desirably performed at a temperature equal to or lower than a melting point of the materials used. For example, in the case of CsI, the preheating temperature is preferably 50 to 550° C., more preferably, 100 to 500° C. In the case of TlI, 50 to 500° C. is preferable, and 100 to 500° C. is more preferable.

Evacuation is once performed inside the vapor deposition apparatus, and a vacuum level is adjusted by introducing an Ar gas, and then the substrate is rotated. The substrate is rotated, preferably, 2 to 15 times, more preferably, 4 to 10 times although it depends on a size of the apparatus. Next, the crucible of the phosphor parent compounds (CsI: not including augmenting agent) is heated, and the phosphor is vapor-deposited to form a foundation layer. A temperature of the substrate at this point is, preferably, 5 to 100° C., more preferably, 15 to 50° C. Preferably, a thickness of the foundation layer is 0.1 to 50 µm although it depends on the crystal diameter and the thickness of the scintillator layer. Next, heating the substrate is started, and the substrate temperature is heated to 150 to 250° C., and evaporation of the crucible of the remaining phosphor parent compound (CsI: not including augmenting agent) and augmenting agent (TlI) is started. At this point, preferably, the phosphor parent compound is evaporated at a vapor deposition rate faster than that of the foundation layer, considering productivity. Vapor deposition is performed at the rate, preferably, 5 to 100 times faster, more preferably, performed at the rate 10 to 50 times faster than that during vapor deposition of the foundation layer although it depends on the thicknesses of the foundation layer and the scintillator layer. The higher the heating temperature of the crucible is and the faster the vapor deposition rate is, the more a required vapor deposition time can be shortened, and this can improve productivity. The crystal diameter is increased by shortening the vapor deposition time, and characteristics of the radiological image tend to be deteriorated. Therefore, any kind of control may be performed for the heating temperature of the crucible and the vapor deposition rate at the time of forming the foundation layer and the scintillator layer, considering productivity and the characteristics of the radiological image. As for an evaporation method of the augmenting agent, only the augmenting agent may be evaporated, but an evaporation source in which CsI and TlI are mixed may be prepared, and then evaporation may be performed by heating the evaporation source up to a temperature at which only TlI is evaporated and CsI is not evaporated.

Since the support body heated during vapor deposition has a high temperature, the support body is needed to be cooled to be ejected. An average cooling rate in a process of cooling the scintillator layer down to 80° C. is set within a range from 0.5° C. to 10° C./min., thereby enabling cooling without damaging the substrate. Such cooling is especially effective in the case of, for example, using a relatively thin substrate such as a polymer film having a thickness of 50 µm or more and 500 µm or less as the support body. This cooling process is particularly and preferably performed in an atmosphere having a vacuum level of $1 \times 10^{-5}$ Pa to 0.1 Pa. Additionally, a unit adapted to introduce an inert gas such as Ar or He during the cooling process may be provided inside the vacuum container of the vapor deposition apparatus. Meanwhile, the average cooling rate referred herein corresponds to a cooling rate per minute acquired during a period in which a time and a temperature while cooling is started (when vapor deposition is finished) and performed down to the temperature of 80° C. are consecutively measured.

After finishing vapor deposition, the scintillator layer may also be subjected to heating processing.

Scintillator Panel and Radiological Image Conversion Panel

The scintillator panel according to the present invention is obtained by disposing the above-described scintillator layer on the support body.

Figure 2:
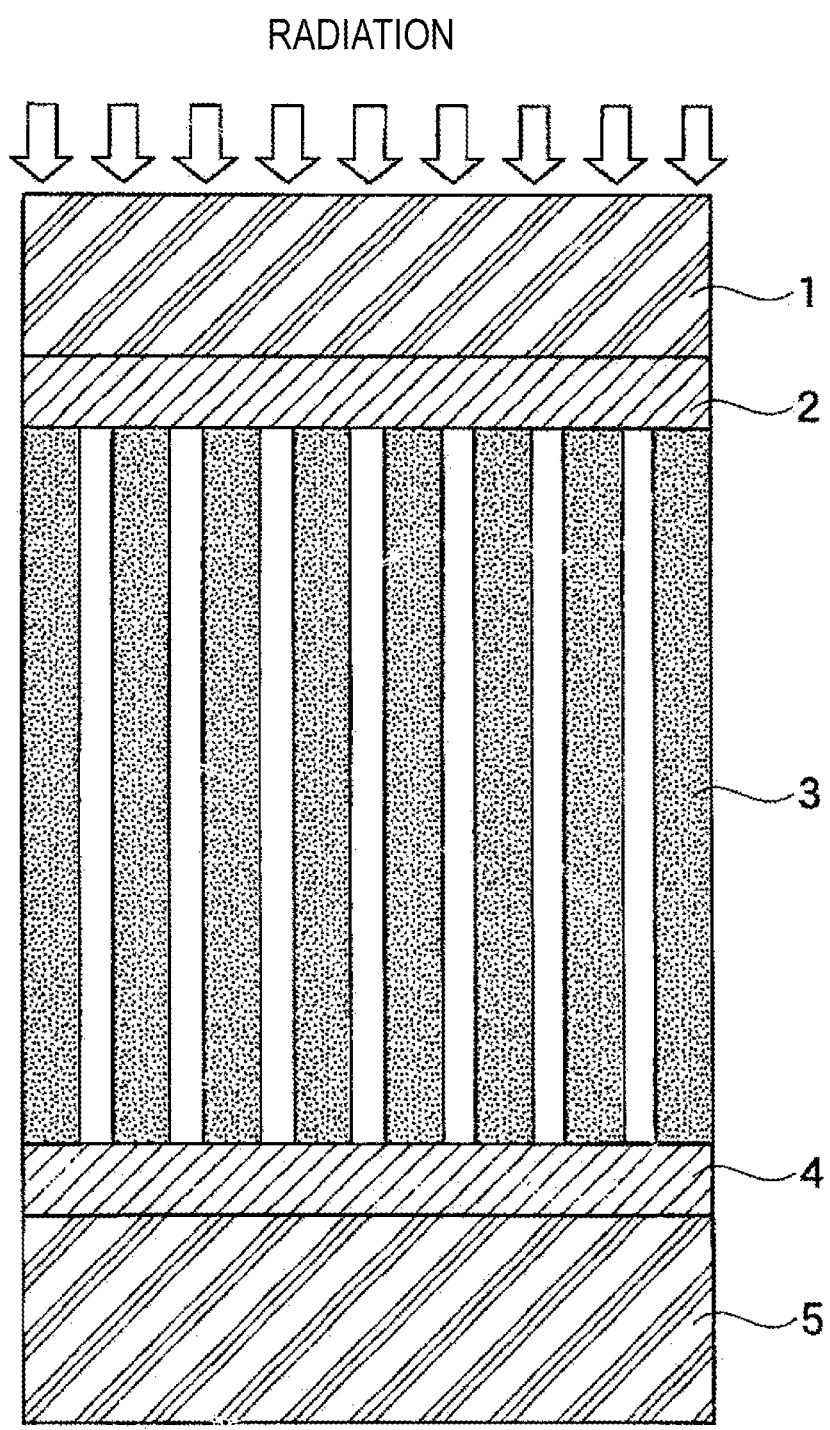
FIG. 2 is a schematic diagram of a scintillator panel according to an embodiment of the present invention.

A schematic diagram of the scintillator panel and the radiological image conversion panel according to an embodiment of the present invention is illustrated in FIG. 2. The scintillator panel includes a scintillator layer as an essential component and includes: a support body 1; a reflection layer 2; a scintillator layer 3; and an adhesive layer 4 as illustrated in, for example, in FIG. 2, and further includes a sensor panel (may also be referred to as a TFT panel) 5 including a photoelectric conversion element in the case of a radiological image conversion panel.

The support body 1 is used as a base to form a columnar crystal constituting the scintillator layer 3, and also has a role to hold a structure of the scintillator layer.

For the materials of the support body, various kinds of glass, a polymer material, a metal, and the like capable of transmitting radiation such as X-rays may be exemplified. More specifically, it may be possible to use sheet glass such as quartz, borosilicate glass, and chemically reinforced glass; ceramics such as amorphous carbon, sapphire, silicon nitride, and silicon carbide; semiconductors such as silicon, germanium, gallium arsenide, gallium phosphide, and gallium nitride; polymer films (plastic films) such as a cellulose acetate film, a polyester resin film, a polyethylene terephthalate film, a polyamide film, a polyimide film, a triacetate film, a polycarbonate film, and a carbon fiber-reinforced resin sheet; metal sheets such as an aluminum sheet, an iron sheet, and a copper sheet, or a metal sheet including a covering layer of the mentioned metal oxide; and a bio-nanofiber film. These materials may also be singly used or used in a layered manner.

Among these materials of the support body, a polymer having a thickness of 50 to 500 μm and having flexibility is particularly preferable, and above all, polyimide is especially preferable from the viewpoint of heat resistance during vapor deposition.

The scintillator panel may further include the reflection layer (indicated by 2 in FIG. 2), a protection layer, a moisture-resistance protection film, the adhesive layer (indicated by 4 in FIG. 2), and the like in addition to the scintillator layer in the same manner as a known scintillator panel in the related art. Since the radiological image conversion panel according to the present invention includes the scintillator layer and the photoelectric conversion element, the radiological image conversion panel can be used as a radiological image detector. In this case, the scintillator layer is preferably directly coupled to the photoelectric conversion element panel (indicated by 5 in FIG. 2) embedded with the photoelectric conversion element from the viewpoint that emitted light generated at the scintillator layer can enter the photoelectric conversion element panel, and the like.

The reflection layer 2 is a main surface side that is an opposite side of the photoelectric conversion element panel of the scintillator layer, and also is disposed at a position between the support body and the scintillator layer, thereby enabling fluorescence (emitted light) generated at the scintillator layer to be more efficiently guided to the photoelectric conversion element panel. As recited in Non-Patent Literature 1, even in the case where the amount of luminescence is reduced at a specific concentration of the augmenting agent (thallium), intensity of the fluorescence guided to the photoelectric conversion element panel can be prevented from further being reduced by using the reflection layer 2. Therefore, using the reflection layer 2 is particularly preferable.

As for material quality of the reflection layer, a material having a material quality similar to material quality used in a known scintillator panel in the related art can be adopted. Especially, a metal having high reflectance is preferable. The metal has electric conductivity of, preferably, 6.0 S/m (siemens per meter) or more, more preferably, 30 S/m or more. The metal contained inside the material quality of the reflection layer may be one kind or may be two or more kinds. An example of a metal film layer having high reflectance may be a material including at least one kind of metal selected from a group including Al, Ag, Cr, Cu, Ni, Mg, Pt, and Au. Among these metals, particularly, Al (40 S/m), Ag (67 S/m), and Au (46 S/m) are preferable from the viewpoints of reflectance and electric conductivity. Additionally, the reflection layer may be formed of a white pigment and an appropriate binder resin. The reflection layer may be formed of a single layer or may be formed of two or more layers.

The reflection layer can be directly attached to, for example, the support body by vapor deposition, sputtering deposition, plating, and coating, but attachment by the sputtering deposition or coating is preferable from the viewpoint of productivity. In the case of attachment by the vapor deposition, sputtering deposition, and plating, the reflection layer can be formed from a material including one kind or two or more kinds of elements or an alloy out of aluminum, silver, platinum, palladium, gold, copper, iron, nickel, chromium, cobalt, and stainless steel. However, an alloy having silver or aluminum as a main component is preferable from the viewpoint of high reflectance. Additionally, two or more of such metal layers may also be formed. In the case of forming two or more metal layers, a lower layer preferably includes nickel (Ni) or chromium (Cr) or both thereof from the viewpoint of enhancing adhesiveness with the support body. Additionally, reflectance may also be further improved by providing layers formed of metal oxides such as silica ($SiO_2$) and titanium dioxide ($TiO_2$) in this order. The method of forming the above-described metal layers on the support body may be vapor deposition, sputtering, metal foil lamination, or the like, which are not particularly limited, but sputtering is most preferable from the viewpoint of adhesion. The metal reflection layer has a film thickness of, preferably, 50 nm to 400 nm, more preferably, 10 nm to 200 nm although it depends on an attachment method of the metal reflection layer. In the case of including the metal reflection layer, a protection layer (hereinafter also referred to as "metal reflection layer protection layer") may also be formed between the metal reflection layer and the scintillator layer in order to prevent corrosion and the like of the metal reflection layer due to phosphor inside the scintillator layer. Preferably, the metal reflection layer protection layer is formed by coating a coating material obtained by melting a resin in solvent and then drying the coating material from the viewpoint of enhancing adhesiveness and improving productivity. As the resin of the metal reflection layer protection layer (also the resin to be melted in the solvent), a polymer having a glass transition temperature of 30 to 100° C. is preferable.

Specifically, as resins of the metal reflection layer protection layer, it may be possible to exemplify: a polyurethane resin, a vinyl chloride copolymer, a vinyl chloride vinyl-acetate copolymer, a vinyl chloride-vinylidene chloride copolymer, a vinyl chloride-acrylonitrile copolymer, a butadiene-acrylonitrile copolymer, a polyamide resin, a polyvinylbutyral, a polyester resin, a cellulose derivative (such as nitrocellulose), a styrene-butadiene copolymer, various kinds of synthetic rubber resins, a phenolic resin, an epoxy resin, a urea resin, a melamine resin, a phenoxy resin, a silicone resin, an acrylic resin, a urea formamide resin, and the like, but particularly, the polyester resin is preferable.

The metal reflection layer protection layer has a film thickness of, preferably, 0.1 μm or more from the viewpoint of adhesiveness (film attachment) between a vapor-deposited crystal (phosphor that is a columnar crystal inside the scintillator layer) and the reflection layer, and also has the film thickness of, preferably, 3.0 μm or less from the viewpoint of ensuring smoothness of a surface of the protection layer. More preferably, the metal reflection layer protection layer has the thickness in a range of 0.2 to 2.5 μm in the same viewpoint.

Additionally, a method of attaching, as the reflection layer, a layer including a resin made of at least a light scattering particle and a binder as a main component and having elasticity may be one mode. For example, by using the reflection layer by coating, a defect such as an uneven portion exiting on the substrate can be covered and hidden, and therefore, unevenness on the scintillator layer surface can also be suppressed. As a result, adhesiveness with the photoelectric conversion element is enhanced, and fluorescence is easily guided to the photoelectric conversion element panel. Therefore, such a reflection layer is preferable. In the case of forming the scintillator layer by using vapor deposition, unevenness is particularly likely to appear on the scintillator layer surface due to abnormal growth of a scintillator crystal generated during the vapor deposition. Therefore, forming the scintillator by combining the reflection layer including the elastic resin as the main component is especially preferable from the viewpoint of suppressing unevenness on the scintillator layer surface. Furthermore, in the case where the film thickness of the scintillator layer is thick also, the film thickness is largely varied and unevenness on the scintillator layer surface tends to be increased. Therefore, suppressing unevenness on the scintillator layer surface by combining the reflection layer having the elastic resin as the main component is particularly preferable. Even in the case of the scintillator in which the augmenting agent is low-concentrated as recited in "Evaluation of a structured cesium iodide film for radiation imaging purposes." Nuclear Science Symposium and Medical Imaging Conference in 1993, 1993 IEEE Conference Record, IEEE, 1994 by Jing, T., et al., intensity of fluorescence can be prevented from being decreased because fluorescence is easily guided to the photoelectric conversion element panel by the reflection layer. Therefore, such a reflection layer is particularly preferable. Additionally, since the reflection layer is made of the layer having the elastic resin as the main component, a projecting portion formed on the scintillator layer surface is pushed into the reflection layer when the scintillator layer is pressed and bonded to the photoelectric conversion element by biasing the scintillator panel from the support body side, and the scintillator layer and the photoelectric conversion element are made contact uniformly. Consequently, electric charge caused by oscillating motion can be suppressed.

In the following, a description will be provided for the case where the reflection layer is the layer having the elastic resin as the main component.

A material constituting the reflection layer is, preferably, a soft resin that can absorb unevenness on the scintillator layer 3. Specifically, it may be possible to exemplify: a vinyl chloride copolymers such as a vinyl chloride-vinyl acetate copolymer, a vinyl chloride-vinylidene chloride copolymer, and a vinyl chloride-acrylonitrile copolymer; synthetic rubbers and other resins such as a silicone resin, an acrylic resin, a polyurethane resin, a polyamide resin, a butyral resin (such as polyvinyl butyral), a polyester resin, a cellulose derivative (such as nitrocellulose), poly-para-xylylene, a butadiene-acrylonitrile copolymer, and a styrene-butadiene copolymer; and thermosetting resins such as a phenolic resin, an epoxy resin (such as phenoxy resin), a urea resin, a melamine resin, and a formamide resin. Of these, hydrophobic resins such as a polyester resin, a polyurethane resin, and a butyral resin are preferable from the viewpoint of forming cesium iodide (CsI) that is deliquescent. Additionally, two or more kinds of the above-described resins may also be used. Particularly, a coating film property can be easily controlled by using two or more kinds of resins having glass transition temperatures (Tg) different from each other by 5° C. or more. Therefore, using two or more kinds of the resins is preferable. The resins to be used in this case may be the same kind or different kinds as far as the glass transition temperatures are different.

The reflection layer has an elastic modulus of, preferably, 0.001 to 10 GPa, more preferably, 0.01 to 5 GPa, and furthermore preferably, 0.01 to 1 GPa. When the elastic modulus of the reflection layer is 0.001 GPa or more, stickiness of the surface of the reflection layer is reduced, and an image defect is likely to be decreased because a foreign matter hardly adheres during manufacture. On the other hand, when the elastic modulus of the reflection layer is 10 GPa or less, a projecting portion formed on the scintillator layer surface can be absorbed by the reflection layer, and the scintillator layer and the photoelectric conversion element can be made to uniformly contact each other, and electric charge caused by oscillating motion is easily suppressed.

The film thickness of the reflection layer is needed to be larger than a difference between a maximal value and a minimal value of the film thickness of the scintillator layer. The film thickness of the reflection layer is, preferably, 1.5 to 30 times of the difference between the maximal value and the minimal value of the film thickness of the scintillator layer, more preferably, 2 to 10 times, and furthermore preferably, 2 to 5 times. Specifically, the reflection layer has the thickness of normally 10 to 300 μm, preferably, within a range of 30 to 100 μm. When the film thickness of the reflection layer is 1.5 times or more of the film thickness of the phosphor, a projecting portion formed on the scintillator layer surface is easily absorbed by the reflection layer, and the scintillator layer and the photoelectric conversion element are made to uniformly contact each other, thereby easily suppressing electric charge caused by oscillating movement. On the other hand, when the film thickness of the reflection layer is 30 times or less of the film thickness of the phosphor, the support body tends to be prevented from being largely warped by residual stress after film formation. When the scintillator layer is vapor-deposited on such a support body, cracking hardly occurs in the scintillator layer, and image quality (especially sharpness) tends to be improved.

The reflection layer may be formed of one layer or two or more layers.

In the present invention, the scintillator layer is biased from the support body side, and the scintillator panel is pressed and bonded to the photoelectric conversion element. The method of biasing the scintillator layer is not particularly limited, but for example, pressing an elastic body such as a cushion member, pressing with atmosphere pressure by vacuum sealing, mechanical pressing with a screw, and the like may be exemplified.

The reflection layer may include a filler. As the filler, it may be possible to exemplify a light reflective particle that reflects light at the reflection layer, a light absorbing particle that absorbs light, or the like.

The light reflective particle included in the reflection layer has a function to improve sharpness by preventing, inside the reflection layer, optical diffusion of the emitted light generated at the scintillator layer. Additionally, the light reflective particle has a function to improve sensitivity by effectively returning the emitted light that has reached the reflection layer to the inside of the columnar crystal of the scintillator layer.

For such a light reflective particle, those commercially available may be used, or the light reflective particle may be manufactured in accordance with a known method.

The light reflective particle is not particularly limited as far as the light reflective particle is a particulate material having an refraction index different from the above-described materials constituting the reflection layer, and it may be possible to exemplify as the materials thereof: alumina; an yttrium oxide; a zirconium oxide; a titanium dioxide ($TiO_2$); a barium sulfate; silica; a zinc oxide; a calcium carbonate; glass; a resin; and the like. These material may be singly used, or two or more kinds thereof may also be mixed and used (as for the above materials, two or more kinds of materials belonging to different categories such as glass and resin categories may be used; two or more kinds of materials belonging to the same category, such as an acrylic resin and a polyester resin in the resin category, may also be used; and one kind of material or two or more kinds of materials respectively belonging to different categories or the same category, such as glass, an acrylic resin, and a polyester resin may also be used.)

Among these materials, for example, a glass bead, a resin bead, and the like, particularly, the glass bead is preferable because: since a refractive index can be more freely set compared to a metal oxide, the glass bead has a characteristic of easily controlling an optical diffusion property.

A glass bead having a higher refractive index is preferable, and it may be possible to exemplify: BK7 (n=about 1.5, n represents a relative refractive index, the same is applied hereinafter); LaSFN9 (n=about 1.9); SF11 (n=about 1.8); F2 (n=about 1.6); BaK1 (n=about 1.6); barium titanate (n=about 1.9); blue glass having high refractive index (n=about 1.6 to 1.7); $TiO_2$—BaO (n=about 1.9 to 2.2); borosilicate (n=about 1.6); chalcogenide glass (n=about 2 or more); and the like. As the resin bead, it may be possible to use an acrylic particle, a polyester resin particle, a polyolefin particle, and a silicone particle, and the like, and specifically, CHEMISNOW (registered trademark) (manufactured by Soken Chemical & Engineering Co., Ltd.), Silicone Resin KR Series (manufactured by Shin-Etsu Chemical Co., Ltd.), TECHPOLYMER (registered trademark) (manufactured by SEKISUI PLASTICS CO., LTD.), and the like.

A white pigment such as a titanium dioxide has high a concealing property and a high refractive index. Therefore, the white pigment can easily scatter the emitted light of the scintillator by reflecting and refracting the light, and can also significantly improve sensitivity of the radiological image conversion panel and the like including the scintillator panel.

As the light reflective particle, a titanium dioxide is particularly preferable in the viewpoint of easy availability and the high refractive index. In the case of using a titanium dioxide as the light reflective particle, the titanium dioxide may be subjected to surface treatment with an inorganic compound or an organic compound in order to improve dispersibility and workability. As the above-described titanium dioxide subjected to the above-described surface treatment and the surface treatment method, it may be possible to adopt those disclosed in, for example, JP 52-35625 A, JP 55-10865 A, JP 57-35855 A, JP 62-25753 A, JP 62-103635 A, JP 9-050093 A, and the like. In the surface treatment, preferably, it may be possible to use, as surface treatment agents: inorganic compounds such as an aluminum oxide hydrate, a hydrous zinc oxide, and a silicon dioxide; organic compounds such as dihydric to tetrahydric alcohol, trimethylol-amin, a titanate coupling agent, and a silane coupling agent; and the like. A use amount of these surface treatment agents may be selected depending on each of usages as disclosed in JP 2012-098110 A, JP 2008-051793 A, JP 2015-017972 A, and the like.

The titanium dioxide may has a crystal structure of any type of rutile, brookite, and anatase, but the rutile type is particularly preferable from the viewpoints of having a high rate relative to the refractive index of the resin, achieving high luminance, reflectance of visible light, and the like.

As the titanium dioxide, it may be possible to exemplify: those produced by a hydrochloric acid process such as CR-50, CR-50-2, CR-57, CR-80, CR-90, CR-93, CR-95, CR-97, CR-60-2, CR-63, CR-67, CR-58, CR-58-2, CR-85; those produced by a sulfuric acid process such as R-820, R-830, R-930, R-550, R-630, R-680, R-670, R-580, R-780, R-780-2, R-850, R-855, A-100, A-220, W-10 (trade names, manufactured by ISHIHARA SANGYO KAISHA, LTD), and the like.

The titanium dioxide has an area average particle diameter of, preferably, 0.1 to 5.0 μm, more preferably, 0.2 to 0.3 μm from the viewpoint of reflectance. Additionally, as the titanium dioxide, a titanium dioxide subjected to surface treatment with oxides of Al, Si, Zr, Zn and the like is particularly preferable in order to improve affinity and dispersibility relative to a polymer and suppress deterioration of the polymer.

However, in the case of using a titanium dioxide as the light reflective particle, reflectance of light having a wavelength of 400 nm or less is low and also a binder tends to be deteriorated due to photocatalytic action of the titanium dioxide. Considering such viewpoints, it is preferable to use the titanium dioxide in combination with at least one kind of light reflective particle selected from among barium sulfate, alumina, an yttrium oxide, and a zirconium oxide which have a high reflectance even at the wavelength of 400 nm or less. From the view point of having a high reflectance at the wavelengths of 400 nm or less, barium sulfate is more preferable. A ratio between an amount of barium sulfate and that of the titanium dioxide is preferably 95:5 to 5:95, more preferably, 20:80 to 5:95 in a mass ratio.

Additionally, the light reflective particle is preferably formed of at least one kind of particle selected from a solid particle and a void particle.

The void particle is not particularly limited as far as the particle includes a void, and for example, a single-hollow particle having one hollow portion inside the particle, a multi-hollow particle having multiple hollow portions inside the particle, a porous particle, and the like may be exemplified, and selection is made from among these particles depending on a purpose.

Of these void particles, the single-hollow particle and the multi-hollow particles are preferable.

Here, the void particle indicates a particle having a void such as a hollow portion or a pore.

The "hollow portion" indicates a hole (air layer) inside the particle.

The hollow particle can provide the reflection layer with optical reflection characteristics and diffusion characteristics, which the solid particle does not have, by a refractive index difference between the hole (air layer) and an outer shell portion (such as resin layer).

The multi-hollow particle indicates a particle having a plurality of above-described holes inside the particle. Additionally, the porous particle indicates a particle having a pore in the particle, and the pore indicates a portion recessed toward the inside of the particle from a surface of the particle. As a shape of the pore, it may be possible to exemplify: a cavity shape, a shape recessed toward the inside or the center of the particle, like a needle-like shape or a curved shape; a shape in which such a recessed shape penetrates the particle, and the like. The pore may have various sizes and volumes and not particularly limited to those described above.

A material of the void particle is not particularly limited, and it may be possible to make suitable selection in accordance with a purpose, but for example, the above-described materials may be exemplified, and particularly, a thermoplastic resin such as a styrene-acryl copolymer can be suitably exemplified among these materials.

The void particle may be appropriately manufactured or may also be the one commercially available. As the one commercially available, it may be possible to exemplify ROPAQUE HP1055 and ROPAQUE HP433J (all manufactured by ZEON CORPORATION), SX866 (manufactured by JSR Corporation), and the like.

As the multi-hollow particle, Sylosphere (registered trademark), Sylophobic (registered trademark) manufactured by FUJI SILYSIA CHEMICAL LTD., and the like may be suitably used.

Among these void particles, the multi-hollow particle is particularly preferable from the viewpoint of a void percentage.

In the case of using the void particle as the light reflective particle, the light reflective particle may be formed of only a particle having one kind of shape among the particles having the above-described shapes, or may include two or more kinds of void particles. Additionally, the solid particle and the void particle may be used in combination.

Furthermore, the void particle and a white pigment may be used in combination, and the white pigments such as a titanium dioxide, alumina, an yttrium oxide, a zirconium oxide, and a barium sulfate adsorb water ($H_2O$) and a carbon dioxide ($CO_2$) on the surfaces thereof, and release the same when exposed to heat or X-ray energy, and degradation of the scintillator characteristics can be prevented. In other words, by using the void particle and the white pigment in combination, water ($H_2O$) and an impurity gas such as carbon dioxide ($CO_2$) are suppressed from being released from the white pigment, and degradation of the scintillator characteristics is prevented.

Additionally, in the case of using the white pigment, a large number of bubbles may be formed inside the reflection layer. The bubbles absorb desorption of water ($H_2O$) and carbon dioxide ($CO_2$) from the surface of white pigment, and degradation of the scintillator characteristics caused thereby can be prevented. In the case of adopting this method, the bubbles contact the white pigment having a large refractive index difference inside the reflection layer. Therefore, a difference of the refractive index between the materials constituting the reflection layer is increased, and reflectance of the reflection layer is improved.

Preferably, the light reflective particle has an area average particle diameter of 0.1 µm to 5.0 µm, considering reflectance, prevention of cracking on the reflection layer surface, and stability of coating liquid prepared to form the reflection layer (hereinafter, the coating liquid may be also referred to as "coating liquid for reflection layer forming", and coating liquid for other usages is also referred in a similar manner). When the area average particle diameter of the light reflective particle is set within the above-described range, light scattering occurs efficiently in the reflection layer 2, transparency is reduced, reflectance is improved, also temporal stability of the coating liquid for reflection layer forming is improved, and cracking is not caused on the reflection layer 2 by drying after coating.

The light reflective particle has particle size distribution in a range of, preferably, 0.05 µm to 10.0 µm from the viewpoint of dispersibility of the light scattering particles to the reflection layer.

An amount of the light reflective particle included in 100 vol % of a total volume of components constituting the reflection layer 2 is normally in a volume of 3 to 70 vol %, preferably, 10 to 50 vol %. When the light reflective particle is included within the above-described range, reflectance is improved without deteriorating the function of the reflection layer, and sensitivity of the scintillator panel is improved. Furthermore, adhesiveness between the scintillator layer and the reflection layer or between the support body and the reflection layer tends to be enhanced.

Additionally, the reflection layer including the light reflective particle preferably includes voids originated from the void particles and bubbles in a volume amount of 5 to 30 vol %.

The light absorbing particle included in the reflection layer is used to accurately and easily adjust the reflectance of the support body with a desired value. As the light absorbing particle, a pigment having optical absorptivity and the like may be exemplified.

As the pigment having optical absorptivity, various kinds of known pigments in the related arts may be used. A pigment that absorbs a long-wavelength red component which is more prone to scatter is suitable, and a blue coloring material is preferable. As this blue coloring material, for example, ultramarine blue, Prussian blue (iron ferrocyanide), and the like are preferable. Furthermore, as an organic blue pigment, phthalocyanine, anthraquinone, indigoid, carbonium, and the like may be used. Among these, phthalocyanine is preferable from the viewpoint of the radiation resistance property and a UV resistance property of a pigment layer having optical absorptivity. Furthermore, titanium black that is a titanium-based black pigment may also be suitably used. The titanium black is blackened by removing partial oxygen from a titanium dioxide, and particularly, in the case of using titanium dioxide as a light scattering particle, stability of coating liquid for cushion layer forming is high because of having a specific gravity same as titanium dioxide, and there is a merit in which reflectance of a vapor deposition substrate can be easily adjusted by adjusting a mixing ratio between titanium dioxide and titanium black. An amount of the pigment included in 100 vol % of a total volume of components constituting the reflection layer is, preferably, 3 to 70 vol % from the viewpoint of absorptivity.

Additionally, a hardening agent may be added to the reflection layer. By adding the hardening agent, deformation and cracking caused by heat at the time of layering the scintillator by vapor deposition can be prevented. The hardening agent that can be used in the reflection layer according to the present invention is not particularly limited, and for example, it may be possible to exemplify: a multifunctional isocyanate and a derivative thereof; a melamine and a derivative thereof; an amino resin and a derivative thereof; and the like. However, preferably, a multifunctional isocyanate compound is used as the hardening agent, and for example, CORONATE HX, CORONATE 3041, CORONATE 2030, and the like produced by TOSOH CORPORATION) may be exemplified. As for a using amount of the hardening agent, preferably, the hardening agent is added at a ratio of 50 mass % or less relative to a resin, and particularly, 5 to 40 mass % is preferable.

An outer periphery of the scintillator panel is preferably covered with a moistureproof protective film. The moistureproof protective film has a role to protect an entire scintillator panel from moisture, and suppress degradation of the scintillator layer (for example, degradation of the scintillator layer caused by deliquescence of the phosphor in the case where the phosphor of the scintillator layer is deliquescent).

As the moistureproof protective film, it may be possible to exemplify a protective film having low moisture permeability, a moistureproof film such as polyparaxylylene, and the like. For example, in the case of protective film, a polyethylene terephthalate film (PET) may be used. Besides PET, it may be possible to use a polyester film, a polymethacrylate film, a nitrocellulose film, a cellulose acetate film, a polypropylene film, a polyethylene naphthalate film, and the like. Furthermore, the moistureproof protective film may have a structure formed of a plurality of vapor-deposited films obtained by vapor-depositing a metal oxide or the like on the above-mentioned films in accordance with required moisture proofness. The moistureproof protective film has a thickness of, preferably, 10 to 100 μm.

The scintillator panel and the radiological image conversion panel according to the present invention may have the adhesive layer 4 in order to be firmly bonded to the photoelectric conversion element 5. The adhesive layer 4 is a layer to join the scintillator panel to the photoelectric conversion element 5, and particularly, the adhesive layer 4 and the scintillator layer 3 are directly bonded. In the case where the adhesive layer 4 and the scintillator layer are not directly bonded, for example, in the case where an air layer exists between the adhesive layer 4 and the scintillator layer, or in the case where a protective layer or a moistureproof layer of the scintillator layer exists, light emitted at the scintillator layer is scattered while reaching the photoelectric conversion element and image quality may be degraded.

The adhesive layer 4 is needed to be transparent to an emitted light wavelength of the scintillator layer such that the light emitted at the scintillator layer due to exposure to radiation can efficiently reach the photoelectric conversion element via the adhesive layer 4. Specifically, the adhesive layer 4 has transmissivity of normally 70% or more, preferably 80% or more, furthermore preferably 90% or more relative to the emitted light wavelength of the scintillator layer.

As a material constituting the above-described adhesive layer 4, preferably, a hot-melt sheet, a pressure sensitive sheet, and the like are used.

Here, the hot-melt sheet is a sheet that does not include water or solvent and is formed as a solid at a room temperature, obtained by forming, into a sheet-like shape, an adhesive resin (hot-melt resin) made of a non-volatile thermoplastic material. The hot-melt sheet can join adherends by being inserted between the adherends, and melted at a temperature equal to or higher than a melting point thereof, and then solidified by changing again the temperature to a temperature equal to or lower than the melting point thereof.

Since the hot-melt sheet does not include water or solvent, even when the scintillator layer having a deliquescence property like the scintillator layer formed of, for example, CsI(Na) or CsI(Tl) is made to contact the hot-melt sheet, the scintillator panel does not deliquesce. Therefore, the hot-melt sheet is suitable for joining the scintillator panel and the photoelectric conversion element.

Furthermore, the hot-melt sheet does not include any residual volatile substance and the like, and the adhesive layer 4 shrinks little and exerts excellent dimensional stability even when dried after joining the scintillator panel and the photoelectric conversion element.

When the scintillator panel and the photoelectric conversion element are bonded by using the hot-melt sheet, the holt-melt sheet is needed to be melted at an appropriate temperature and not melted in a market environment.

Specifically, the melting point of the hot-melt resin constituting the adhesive layer 4 is normally set to 50 to 150° C., preferably 60 to 120° C., and more preferably 60 to 90° C. Since a lower limit of the melting point of the hot-melt resin is set within the above-mentioned range, the adhesive layer 4 is prevented from being melted during transportation, use, and storage. Furthermore, since an upper limit of the melting point of the hot-melt resin is set within the above-mentioned range, thermal shrinkage accompanied by cooling after the adhesive layer 4 is heated and melted can be reduced, and warpage of the joined scintillator panel/photoelectric conversion element can be suppressed.

From the viewpoint of adhesiveness, the hot-melt sheet is needed to firmly adhere to the scintillator panel and the photoelectric conversion element without any gap by being heated and melted. Furthermore, from the viewpoint of image quality, it is desirable that the hot-melt resin does not deeply penetrate between the columnar crystals of the scintillator layer. From the above viewpoints, melt viscosity of the hot-melt resin constituting the adhesive layer 4 is set to normally 100 to 100,000 Pa·s, preferably 1,000 to 100,000 Pa·s, and more preferably 1,000 to 10,000 Pa·s. Since a lower limit of the melt viscosity is set within the above-mentioned range, penetration of the adhesive agent between the columnar crystals of a phosphor can be properly controlled. Furthermore, since an upper limit of the melt viscosity is set within the above-mentioned range, desired adhesiveness can be ensured by the adhesive agent adhering to the adherends without any gap.

A penetration depth of the adhesive agent between the columnar crystals of a phosphor in the present invention is set to, preferably, 1 to 50 μm, and more preferably, 5 to 30 μm. Since a lower limit of the penetration depth is set within the above-mention range, adhesiveness between the adhesive agent and the columnar crystals of a phosphor can be ensured. Since an upper limit of the penetration depth is set within the above-mentioned range, the light emitted from the phosphor can be prevented from being scattered between the columnar crystals, and favorable image quality (especially, sharpness) can be obtained.

For the hot-melt resin, it may be possible to use a material including, as a main component, a polyolefin resin, a polyamide resin, a polyester resin, a polyurethane resin, or an acrylic resin, for example. Among these materials, the one including a polyolefin resin as the main component is preferable from the viewpoint of light transmissivity, a moisture proofness, and adhesiveness. As the polyolefin resin, it may be possible to use, for example, ethylene-vinyl acetate copolymer (EVA), an ethylene-acrylic acid copolymer (EAA), an ethylene-acrylate ester copolymer (EMA), an ethylene-methacrylic acid copolymer (EMAA), an ethylene-methacrylate ester copolymer (EMMA), an ionomer resin, and the like. The melting point of the resin can be optionally adjusted by adjusting a monomer ratio of the above-described copolymers. For example, in the case of an EVA-based hot-melt resin, the melting point can be adjusted to a range of 110° C. to 60° C. by setting a weight ratio of vinyl acetate to 1% to 40%. Meanwhile, these resins may be used as a so-called polymer blend obtained by combining two or more kinds.

The above-described adhesive layer 4 may be a layer formed of a hot-melt sheet including one kind or two or more kinds of hot-melt resins having different melting points respectively, or may be formed of a layered body of two or more layers of hot-melt sheets, and the two or more layers have different melting points respectively. In the case where the adhesive layer 4 is the layered body of the two or more layers of hot-melt sheets, a melting point of the hot-melt resin on a side contacting the scintillator panel is preferably higher than a melting point of the hot-melt resin on a side contacting the photoelectric conversion element. Such a structure can, for example, effectively suppress penetration of the hot-melt resin to the columnar crystal because when the scintillator panel and the photoelectric conversion element are heated and pressed and then bonded, the hot-melt resin on the photoelectric conversion element side is melted and exerts high adhesiveness to the photoelectric conversion element for having a low melting point, and in contrast, the hot-melt resin on the scintillator panel side is hardly melted for having a high melting point.

The above-described hot-melt sheet may be formed by coating the melted hot-melt resin with a die-coater or the like, or a commercially available hot-melt sheet may be used as well.

The above-described hot-melt sheet is preferably formed on a separator from the viewpoint of workability. Material quality of the separator is not particularly limited, and a paper or a plastic film such as a polyethylene terephthalate (PET) film may be used, but the plastic film such as the PET film is preferable from the viewpoint of cleanness. Furthermore, from the viewpoint of releasability, preferably, a surface of the separator on which the hot-melt sheet is formed is applied with release treatment such as silicone and the like. The separator may be provided on one side or may also be provided on both sides of the hot-melt sheet, but preferably, the separators are provided on both sides of the hot-melt sheet so as to prevent dust from adhering to a surface of the hot-melt sheet during handling.

In the case of using a hot-melt sheet for the adhesive layer 4, the scintillator panel and the photoelectric conversion element can be joined by inserting the hot-melt sheet between the scintillator panel and the photoelectric conversion element and then heating the hot-melt sheet at a temperature of 50 to 150° C. under a pressure of 10,000 to 1,000,000 Pa. Since the pressure is set to at least 10,000 Pa or more, the scintillator panel and the photoelectric conversion element can be uniformly joined without any air space. On the other hand, since the pressure is set at least 1,000,000 Pa or less, damages to the phosphor can be suppressed, and a risk of deteriorating image quality is reduced. In the case of providing the separator on one side of the hot-melt sheet, preferably, the above-described bonding process is divided into two steps. In other words, in a first step, a surface of the hot-melt sheet on which no separator is provided is made to contact a surface of the scintillator, and pressed and heated under the above-described conditions. Consequently, the hot-melt sheet can be bonded to the scintillator. In a next step, a separator provided on a surface of the hot-melt sheet opposing to the surface bonded to the scintillator is peeled off, and then, the hot-melt sheet is made to contact the surface of the photoelectric conversion element, and pressed and heated under the above-described conditions. Consequently, the scintillator panel can be bonded to the photoelectric conversion element via the hot-melt sheet. Meanwhile, in the above description, an example of bonding the hot-melt sheet to the scintillator panel first has been described, but the hot-melt sheet may be first bonded to the photoelectric conversion element. In the case of providing the separators on both sides of the hot-melt sheet, it is advisable to use procedure same as the above procedures after the separators on the one side is peeled off.

A pressure sensitive adhesive sheet may be used for the adhesive layer 4 in the present invention. As the pressure sensitive adhesive sheet that can be used for the adhesive layer 4 of the present invention, a so-called double-sided tape coated with a pressure sensitive adhesive may be exemplified. Some of the pressure sensitive adhesive include, as a main component, an acrylic resin, a urethane-based resin, a rubber-based resin, or a silicon-based resin, for example. Among these, the one including the acrylic resin or the silicon-based resin as the main component is preferable from the viewpoint of light transmissivity and adhesiveness.

As for commercially available double-sided tapes, No. 5601, No. 5603, No. 5605, and the like manufactured by Nitto Denko Corporation, No. 7027, No. 7029, and the like manufactured by Teraoka Seisakusyo Co., Ltd., and #5402, #5402A, #5405, #5405A, and the like manufactured by Sekisui Chemistry Corporation may be exemplified.

Preferably, the pressure sensitive adhesive sheet that can be used in the present invention is singly formed of an adhesive without including a base material such as a PET film.

In the case of using the pressure sensitive adhesive sheet as the adhesive layer, the pressure sensitive adhesive sheet is inserted between the scintillator panel and the photoelectric conversion element, and the scintillator panel and the photoelectric conversion element are bonded under a reduced pressure of 10,000 to 1,000,000 Pa by using a laminating device or the like.

The hot-melt resin or the pressure sensitive adhesive sheet may include a spacer particle in order to obtain a spacer effect.

The particle intended to obtain the spacer effect preferably has a particle diameter substantially same as a thickness of the adhesive layer and also has a refractive index substantially same as that of a material constituting the adhesive layer. As the spacer particle, a polymer particle normally having a particle diameter of about 1 to 50 µm, a glass bead, and the like may be exemplified. Since such a spacer particle is added to the adhesive layer 4, the film thickness of the adhesive layer 4, namely, a distance between the photoelectric conversion element and the scintillator panel can be uniformly held when the scintillator panel and the photoelectric conversion element are bonded. Furthermore, penetration of the resin constituting the adhesive layer 4 to the columnar crystal can be effectively suppressed. Additionally, it is preferable to use the spacer particle having the refractive index substantially same as that of the resin constituting the adhesive layer 4 from the viewpoint of suppressing light scattering at an interface between the resin constituting the adhesive layer 4 and the spacer particle. Particularly, methyl methacrylate and a styrene copolymer are useful because the refractive index can be optionally adjusted in a range of 1.5 to 1.6 by a composition ratio. As such a product, techpolymer manufactured by SEKISUI PLASTICS Co., Ltd. or the like may be exemplified.

The adhesive layer 4 has a film thickness of normally 1 to 100 μm, preferably 1 to 30 μm, and more preferably 3 to 20 μm. Since the lower limit of the film thickness is set within the above range, adhesiveness between the scintillator panel and the photoelectric conversion element can be ensured. Further, since the upper limit of the film thickness is suppressed within the above ranges, light emitted at the scintillator layer can be suppressed from being scattered inside the adhesive layer 4, and an image having high sharpness can be obtained.

As the adhesive layer of the present invention, the hot-melt sheet is preferable in the following viewpoints.

Since the hot-melt sheet generates no adhesive property at the room temperature, position adjustment is extremely easily performed compared with the pressure sensitive adhesive sheet. In other words, since the adhesive property is generated by heating and melting the hot-melt sheet after the scintillator panel and the photoelectric conversion element are superimposed in a state of having no adhesive property generated, position adjustment can be accurately and easily performed.

Since the elastic modulus of the hot-melt sheet at the room temperature is generally larger than that of the pressure sensitive adhesive sheet, adhesion strength is high. Particularly, in the case where the phosphor constituting the scintillator layer has a columnar structure, the hot-melt sheet moderately penetrates between the columns of the scintillator, thereby more improving adhesiveness.

Since the adhesive layer thus configured is provided, it is possible to prevent a gap from being formed between the scintillator layer and the photoelectric conversion element due to misfitting between unevenness of the scintillator layer surface and unevenness of the photoelectric conversion element. Since the refractive index of the gap is smaller than the refractive index of the adhesive layer 4, florescence is easily guided to the photoelectric conversion element panel because when the adhesive layer 4 is interposed, probability in which fluorescence directed to the photoelectric conversion element from the scintillator is refracted is more reduced. Therefore, interposing the adhesive layer 4 is preferable. Needless to mention, unevenness existing on the substrate and an uneven defect on the scintillator layer surface also can be covered and hidden also by using the reflection layer having an elastic resin as a main component, and fluorescence can be prevented from being reduced by easily guiding the fluorescence to the photoelectric conversion element panel by combining the adhesive layer with the reflection layer having the elastic resin as the main component. Therefore, combining the adhesive layer with the reflection layer having the elastic resin as the main component is also preferable.

The photoelectric conversion element included in the radiological image conversion panel of the present invention has roles to: absorb emitted light generated at the scintillator layer, convert the same to an electric signal by performing conversion into a form of electric charge; and output the electric signal to the outside of the radiological image conversion panel, and a known technology in the related art can be used.

Here, the photoelectric conversion element may be, for example, incorporated in a panel. A structure of the panel incorporated with the photoelectric conversion element (photoelectric conversion element panel) is not particularly limited, but normally has a form in which a substrate for the photoelectric conversion element panel, an image signal output layer, and the photoelectric conversion element are layered in this order.

The photoelectric conversion element may have any specific structure as far as functions to absorb light generated at the scintillator layer and convert the same into the form of electric charge are provided. For example, the photoelectric conversion element included in the radiological image conversion panel according to the present invention may be formed of a transparent electrode, a charge generation layer that generates electric charge by being excited by incident light, and a counter electrode. These transparent electrode, charge generation layer, and counter electrode may be those of a known technology in the related art. Additionally, the photoelectric conversion element included in the radiological image conversion panel according to the present invention may be formed of an appropriate photosensor. For example, the photoelectric conversion element may be formed of a plurality of photodiodes two-dimensionally arranged or may be formed of a two-dimensional photosensor such as charge coupled device (CCD) and a complementary metal-oxide-semiconductor (CMOS) sensor.

EXAMPLES

The present invention will be more specifically described by using an Example below. Note that the present invention is not limited to the following Example unless otherwise departing from the gist of the present invention.

Example 1

(Substrate)

A vapor deposition substrate 43 was formed on a support body of a polyimide film having a thickness of 125 μm (UPILEX-125S made by Ube Kosan Co., Ltd.) in accordance with the following procedures. Coating liquid for reflection layer forming was prepared by: mixing 10 pts. wt. of a polyester resin (Toyobo Co., Ltd. VYLON GK140), 40 pts. wt. of cyclohexanone as solvent, and 40 pts. wt. of methyl ethyl ketone (MEK) 40; and then performing dispersion treatment with a sand mill. The vapor deposition substrate 43 formed of the support body and the reflection layer was manufactured by: coating the polyimide film support body having a width of 500 mm with the coating liquid for reflection layer forming by using comma coater; drying the coating liquid for reflection layer forming for 3 minutes at 180° C.; and forming a resin layer on the support body.

(Manufacture of Scintillator)

Figure 3:
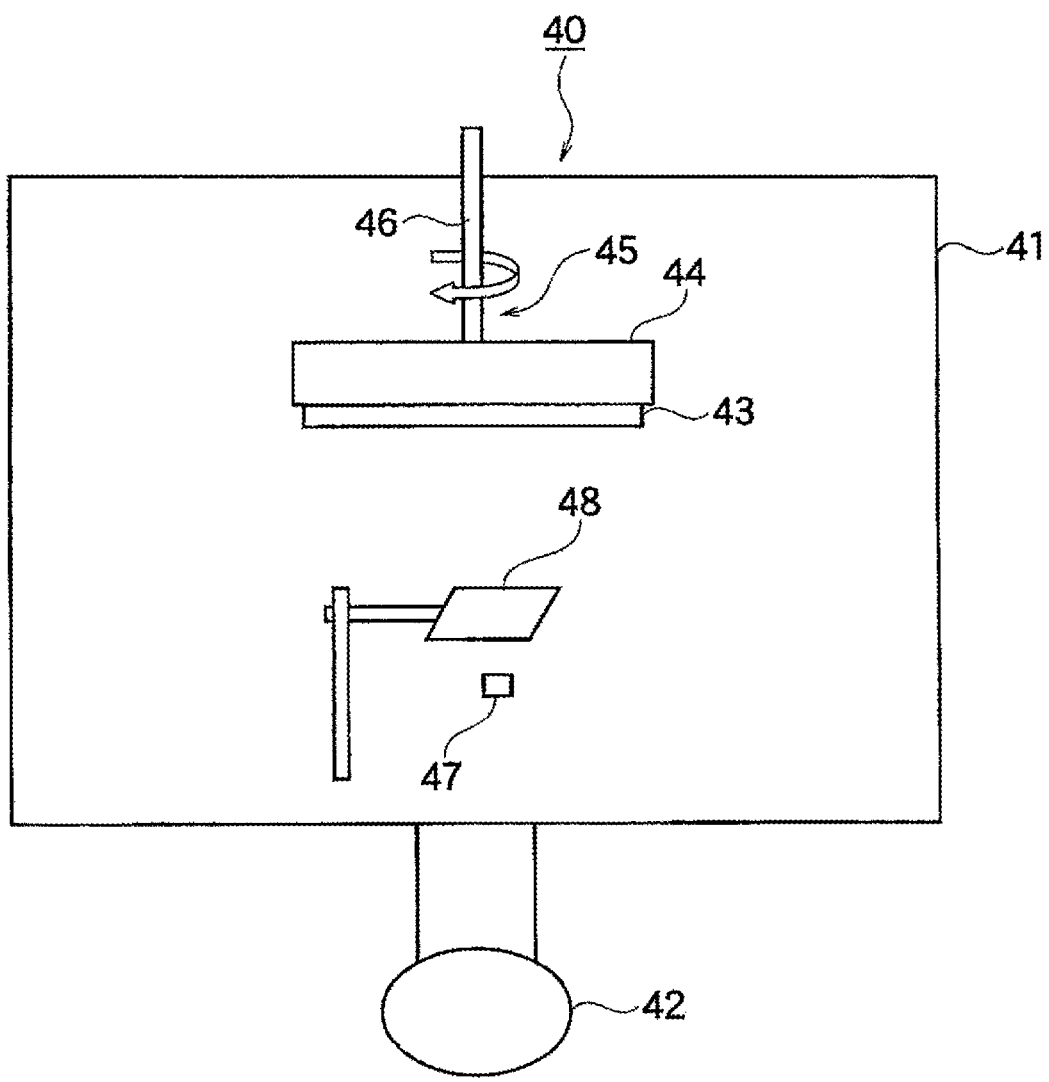
FIG. 3 is a schematic diagram of a manufacturing device used in an Example.

In Example 1, a scintillator layer was formed by forming only one layer on one of main surfaces of the vapor deposition substrate 43 by using a vapor deposition apparatus 40 illustrated in FIG. 3 as described next (note that a vapor deposition source 47c is omitted).

First, a phosphor raw material (CsI) as a vapor deposition material was filled into a first resistance-heating crucible, an augmenting agent (TlI) was filled into a second resistance-heating crucible, and the matters contained in these crucibles were set as vapor deposition sources 47a and 47b respectively. Additionally, the vapor deposition substrate 43 was set at a rotatable holder 44, and an interval between the vapor deposition substrate 43 and the vapor deposition source 47 was adjusted to 400 mm (more specifically, an interval between the vapor deposition substrate 43 and the vapor deposition source 47a and an interval between the vapor deposition substrate 43 and the vapor deposition source 47b were adjusted so as to be 400 mm respectively). A rotation mechanism 45 adapted to rotate the holder 44 was disposed at the holder 44. The rotation mechanism 45 was formed of a rotation shaft 46 connected to the holder 44 and a motor (not illustrated) to be a drive source, and when the motor was driven, the rotation shaft 46 was rotated to rotate the holder 44 in a state facing the vapor deposition source 47.

Subsequently, air contained inside a vacuum container 41 of the vapor deposition apparatus 40 was once evacuated by using a vacuum pump 42, and a vacuum level inside the vacuum container 41 of the vapor deposition apparatus 40 was adjusted to 0.5 Pa (absolute pressure) by introducing an Ar gas, and then the vapor deposition substrate 43 was rotated together with the holder 44 at a rate of 10 rpm. Then, a temperature of the vapor deposition substrate 43 was set to 250° C. at the time of starting vapor deposition, and a concentration of the augmenting agent (Tl) contained in the scintillator was controlled so as to be 0.005 mol %.

Vapor deposition was finished when the film thickness of the scintillator layer has reached 400 μm, and then the scintillator is obtained.

(X-Ray Resistance Property)

First, optical reflectance (A) of the scintillator was acquired by a luminance measuring method described below. Next, an entire surface of the scintillator was exposed to an X-ray of 10 R, and an X-ray rule recorded in the radiological image conversion panel was erased with halogen light. This process was repeatedly performed, and when an accumulated X-ray amount has reached 2000 R, optical reflectance (B) of the scintillator was acquired.

The optical reflectance was measured by using a following measurement device under the same conditions.
Device: Konica Minolta Spectrophotometer CM-2600d
Wavelength of Measured Light: 350 to 750 nm Optical reflectance (A1 and A2) at 440 nm and optical reflectance (B1 and B2) at 520 nm before and after exposure to X-rays were evaluated, and A/B was calculated.

A X-ray resistance property was evaluated based on the following standards by emitting totally 2,000 R of X-rays by consecutively emitting 25 R of X-rays per shot 80 times at tube voltage 80 kVp, and then measuring luminance before and after such exposure to X-rays.

To evaluate luminance, the radiological image conversion panel was set in a PaxScan 2520 (FPD made by Varian Co.) and then exposed to X-rays at the tube voltage 80 kVp, and then an average signal value of obtained image data was deemed as an amount of luminescence.

X-Ray Resistance Property Evaluation Standards
⊚: luminance reduced amount before and after exposure to X-rays is less than 2%
○: luminance reduced amount before and after exposure to X-rays is 2% or more and less than 4%
x: luminance reduced amount before and after exposure to X-rays is 4% or more Luminance Evaluation Standards
⊙ was defined as luminance larger than the luminance in Example 1, and x was defined as luminance smaller than the same.

Examples 2 to 4 and Comparative Examples 1 and 2

A scintillator was manufactured and evaluated in the same manner as Example 1 except for changing a concentration of Tl as shown in Table 1. Results are shown together in Table 1.

TABLE 1

| DATA NAME | Tl CONCENTRATION [mol %] | A/B | X-RAY RESISTANCE PROPERTY | LUMI-NANCE |
|---|---|---|---|---|
| EXAMPLE 1 | 0.005 | 0.75 | ○ | ○ |
| EXAMPLE 2 | 0.01 | 0.85 | ⊚ | ⊚ |
| EXAMPLE 3 | 0.14 | 0.94 | ⊚ | ⊚ |
| EXAMPLE 4 | 0.20 | 1.02 | ○ | ⊚ |
| COMPARATIVE EXAMPLE 1 | 0.53 | 1.17 | X | ⊚ |
| COMPARATIVE EXAMPLE 2 | 0.002 | 0.57 | X | X |

According to an embodiment of the present invention, since variation of the optical reflectance before and after exposure to X-rays is adjusted within a predetermined range, the scintillator having an excellent X-ray resistance property can be obtained.

Although the present invention has been described and illustrated in detail, it is clearly understood that the same is by way of illustrated and example only and is not to be taken by way of limitation, the scope of the present invention being interpreted by terms of the appended claims.

What is claimed is:

1. A scintillator comprising:
   a scintillator layer comprising a phosphor and an augmenting agent, and having an optical reflectance A1 at a wavelength 440 nm and an optical reflectance B1 at a wavelength 520 nm, and
   wherein when an optical reflectance at the wavelength 440 nm is defined as A2 and an optical reflectance at the wavelength 520 nm is defined as B2 after exposure to 2,000 R of radiation, ratios between the optical reflectances "A=A2/A1" and "B=B2/B1" before and after exposure to radiation satisfy "0.70≤AB≤1.10;",
   wherein a concentration of the augmenting agent included in the scintillator is 0.005 to 0.2 mol %, and
   wherein the augmenting agent included in the scintillator includes at least thallium.

2. The scintillator according to claim 1, wherein a concentration of an augmenting agent included in the scintillator is 0.01 to 0.15 mol %.

3. The scintillator according to claim 1, wherein an augmenting agent included in the scintillator includes at least sodium together with thallium.

4. A scintillator panel formed by disposing a layer of the scintillator according to claim 1 on a support body.

5. The scintillator according to claim 1, wherein the scintillator comprises
   a reflection layer comprising a resin comprising a light scattering particle and a binder, wherein the resin has elasticity.

6. The scintillator according to claim 1, wherein the scintillator comprises one of gadolinium oxysulfide, cadmium tungstate, gadolinium silicate, bismuth germanate, lutetium silicate, lead tungstate, and cesium bromide.

7. The scintillator according to claim 1, wherein the scintillator includes at least cesium iodide as a parent material.

8. A radiological image conversion panel comprising:
   a scintillator; and
   a photoelectric conversion panel;
   wherein the scintillator is provided on the photoelectric conversion panel; and
   wherein the scintillator comprises:
      a scintillator layer including a phosphor and an augmenting agent, and having an optical reflectance A1 at a wavelength 440 nm and an optical reflectance B1 at a wavelength 520 nm, and wherein when an optical reflectance at the wavelength 440 nm is defined as A2 and an optical reflectance at the wavelength 520 nm is defined as B2 after exposure to 2,000 R of radiation, ratios between the optical reflectances "A=A2/A1" and "B=B2/B1" before and after exposure to radiation satisfy "0.70≤A/B≤1.10";

a concentration of the augmenting agent included in the scintillator is 0.005 to 0.2 mol %;

the scintillator includes at least cesium iodide as a parent material; and wherein the augmenting agent included in the scintillator includes at least thallium.

9. A scintillator comprising:

a scintillator layer including a phosphor and an augmenting agent, and having an optical reflectance A1 at a wavelength 440 nm and an optical reflectance B1 at a wavelength 520 nm, and wherein when an optical reflectance at the wavelength 440 nm is defined as A2 and an optical reflectance at the wavelength 520 nm is defined as B2 after exposure to 2,000 R of radiation, ratios between the optical reflectances "A=A2/A1" and "B=B2/B1" before and after exposure to radiation satisfy "0.70≤A/B≤1.10;

wherein the augmenting agent included in the scintillator comprises sodium and thallium, and wherein a concentration of the augmenting agent included in the scintillator is 0.005 to 0.2 mol %.

* * * * *